United States Patent
Langhammer

(10) Patent No.: US 9,954,553 B1
(45) Date of Patent: Apr. 24, 2018

(54) CIRCUITRY AND METHODS FOR CONTINUOUS PARALLEL DECODER OPERATION

(71) Applicant: Altera Corporation, San Jose, CA (US)

(72) Inventor: Martin Langhammer, Salisbury (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/844,551

(22) Filed: Sep. 3, 2015

Related U.S. Application Data

(60) Provisional application No. 62/171,379, filed on Jun. 5, 2015.

(51) Int. Cl.
*H03M 13/15* (2006.01)

(52) U.S. Cl.
CPC ..... *H03M 13/1595* (2013.01); *H03M 13/157* (2013.01); *H03M 13/159* (2013.01); *H03M 13/1575* (2013.01)

(58) Field of Classification Search
CPC .......... H03M 13/1595; H03M 13/159; H03M 13/1575
See application file for complete search history.

(56) References Cited

U.S. PATENT DOCUMENTS

| | | | | |
|---|---|---|---|---|
| 3,668,632 A * | 6/1972 | Oldham, III | ........ | G06F 11/1076 714/758 |
| 4,413,339 A * | 11/1983 | Riggle | ................ | H03M 13/151 714/765 |
| 4,777,635 A * | 10/1988 | Glover | .................. | H03M 13/15 714/756 |
| 5,610,929 A * | 3/1997 | Yamamoto | ......... | G11B 20/1866 714/758 |
| 5,635,864 A * | 6/1997 | Jones | ....................... | H03K 5/24 327/63 |
| 5,737,343 A * | 4/1998 | Meyer | ............... | H03M 13/1535 714/784 |
| 5,818,855 A * | 10/1998 | Foxcroft | ............. | H03M 13/151 714/759 |
| 6,026,420 A * | 2/2000 | DesJardins | ............. | G06F 7/724 708/492 |
| 6,539,515 B1 * | 3/2003 | Gong | ................ | H03M 13/1515 714/781 |

(Continued)

*Primary Examiner* — Joseph D Torres

(74) *Attorney, Agent, or Firm* — Fletcher Yoder P.C.

(57) ABSTRACT

Syndrome calculation circuitry for a decoder of codewords having a first number of symbols, where the decoder receives a second number of parallel symbols, and where the first number is not evenly divisible by the second number, includes multipliers equal in number to the second number. Each multiplier multiplies a symbol by a coefficient based on a root of a field of the decoder. The multipliers are divided into a number of groups determined as a function of a modulus of the first number and the second number. Adders equal in number to the groups add outputs of multipliers in respective ones of the groups. Accumulation circuitry accumulates outputs of the adders. Output circuitry adds outputs of the adders to an output of the accumulation circuitry to provide a syndrome. Selection circuitry directs outputs of the adders to the accumulation circuitry or the output circuity, and resets the accumulation circuitry.

18 Claims, 8 Drawing Sheets

(56) References Cited

U.S. PATENT DOCUMENTS

| | | | |
|---|---|---|---|
| 8,312,345 B1* | 11/2012 | Feng | H03M 13/1515 714/746 |
| 2005/0273484 A1* | 12/2005 | Shieh | H03M 13/1525 708/492 |
| 2009/0077449 A1* | 3/2009 | Lee | H03M 13/15 714/785 |
| 2010/0174970 A1* | 7/2010 | Goldberg | H03M 13/152 714/785 |
| 2011/0296281 A1* | 12/2011 | Lin | H03M 13/1515 714/785 |
| 2014/0195881 A1* | 7/2014 | Srivastava | H03M 13/15 714/782 |
| 2014/0229791 A1* | 8/2014 | Langhammer | H03M 13/1595 714/757 |

* cited by examiner

United States Patent US 9,954,553 B1

CIRCUITRY AND METHODS FOR CONTINUOUS PARALLEL DECODER OPERATION

CROSS REFERENCE TO RELATED APPLICATION

This patent document claims the benefit of copending, commonly-assigned U.S. Provisional Patent Application No. 62/171,379, filed Jun. 5, 2015, which is hereby incorporated by reference herein in its entirety.

FIELD OF THE INVENTION

This invention relates to circuitry for implementing a high-speed, parallel decoder, and methods of using that circuitry to receive codewords continuously, even where codeword boundaries may not align with the parallel input boundaries, especially in a programmable integrated circuit device.

BACKGROUND OF THE INVENTION

In BCH-type decoders such as, e.g., Reed-Solomon decoders, slower decoders process one symbol per clock cycle. Parallel processing—processing more than one symbol per clock cycle—greatly improves throughput. Even with a parallelism of '2'—i.e., processing two symbols in parallel per clock cycle—improves throughput.

Depending on the type of code and the code parameters, the number of symbols received per codeword may not divide evenly into a number of clock cycles. One solution is to stop processing at a codeword boundary, even if more time remains in the current clock cycle. However, such a solution, in which there periodically is a clock cycle during which the decoder is inactive during a portion of that clock cycle, wastes resources. Another solution is to provide a second decoder, or at least a partial decoder including at least its own syndrome calculation circuitry, that takes over at the codeword boundary. According to this option, both decoders (or partial decoders) operate during respective portions of the overlap clock cycle, but during other clock cycles only one decoder is active while the other decoder (or partial decoder) is idle.

Building and operating a decoder circuit is straightforward when the code parameters—e.g., codeword length, number of parity symbols—and data rate are known in advance. However, decoders frequently need to operate with different parameters even in a fixed circuit such as an application-specific integrated circuit (ASIC). And for a programmable integrated circuit device—e.g., a field-programmable gate array (FPGA)—where the end-user circuit design is unknown, even more flexibility may be necessary, further complicating the situation.

SUMMARY OF THE INVENTION

In accordance with embodiments of the present invention, syndrome calculation in a decoder is sped up by dividing the vector of received symbols, which are to be processed in parallel, into a number of subgroups based on the modulus of the number of symbols in the codeword relative to the parallelism of the decoder. As described below, this allows a single decoder to operate continuously even though the number of symbols in the codeword is not evenly divisible by the parallelism of the decoder.

Therefore, in accordance with embodiments of the present invention there is provided syndrome calculation circuitry for a decoder of codewords having a first number of symbols, where the decoder receives a second number of symbols in parallel, and where the first number is not evenly divisible by the second number. The syndrome calculation circuity includes a plurality of multipliers equal in number to the second number, each multiplier receiving one of the symbols and multiplying that one of the symbols by a coefficient based on a root of a field of the decoder. The plurality of multipliers is divided into a number of groups of adjacent multipliers, the number of groups being determined as a function of a modulus of the first number and the second number. In a plurality of adders equal in number to the groups, each respective one of the adders adds outputs of multipliers in a respective one of the groups. Accumulation circuitry accumulates outputs of the adders. Output circuitry adds outputs of the adders to an output of the accumulation circuitry to provide a syndrome output. Selection circuitry for directing outputs of the adders to one of the accumulation circuitry or the output circuity, and resets the accumulation circuitry when directing the outputs of the adders to the output circuitry.

A method of operating such circuitry, as well as a method of laying out such circuitry on an integrated circuit device, are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

As noted above, this disclosure describes a high-speed, parallel BCH forward error correction (FEC) decoder, and corresponding methods, that can receive codewords continuously, even where the codeword boundary may not align with the parallel input boundary. Although BCH coding is the general case, a common example would be Reed-Solomon coding, which may be used, for example, in high-speed Ethernet applications.

Figure 1:
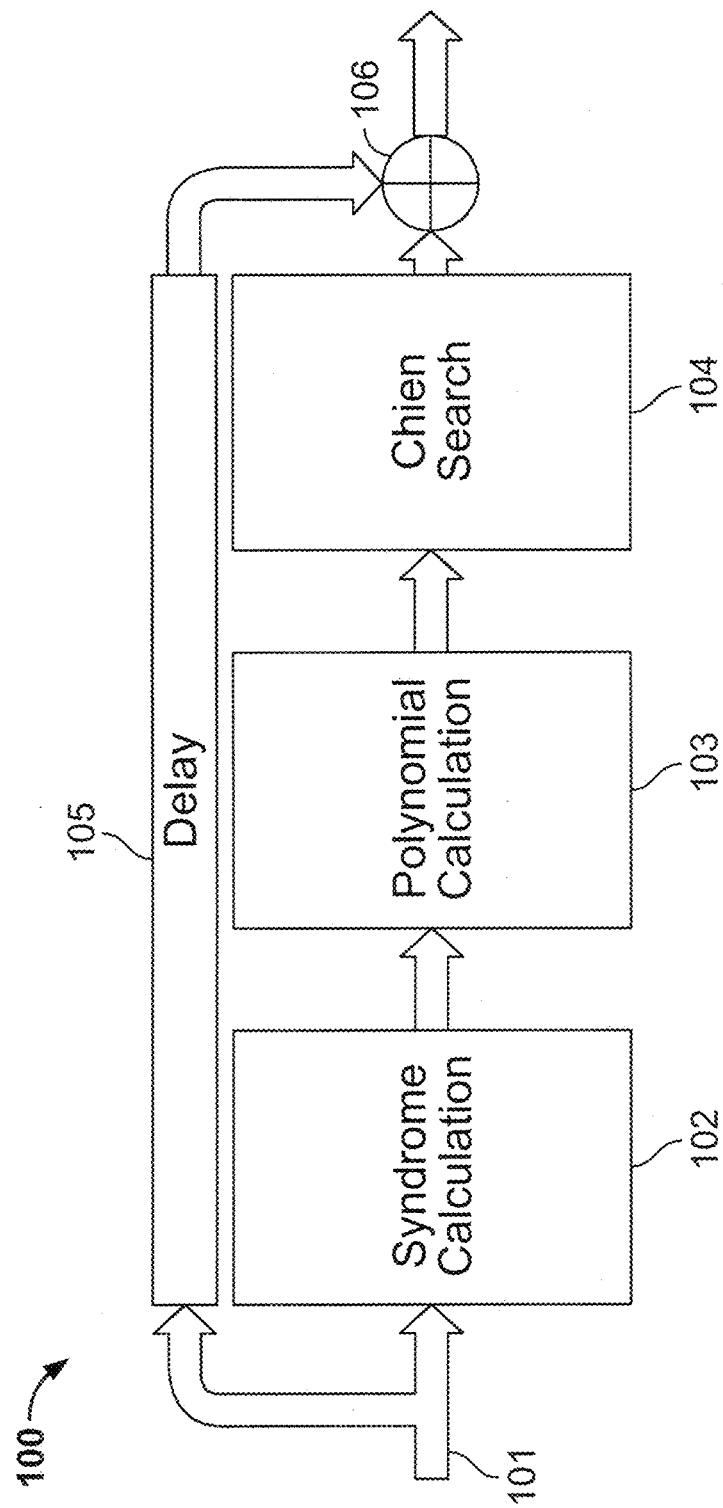
FIG. 1 shows a schematic representation of a generalized BCH decoder.

An example of a generalized BCH decoder 100 is shown in FIG. 1. The data to be decoded is input at 101 to syndrome calculator 102, and then to polynomial calculator 103. The errors are then located in Chien search module 104. The input also is delayed at 105 so that it remains available for combination at 106 with the output of search module 104 for correction of the errors.

The polynomials—i.e., the error-locator polynomial (λ), or, in the case of a Reed-Solomon code, the error-evaluator polynomial (Ω)—can be calculated at 103 by any known method, as long as the calculation is completed before the next set of syndromes is received from syndrome calculator 102. The polynomial calculation may be interleaved between multiple polynomial engines, as also is well known.

The Chien search at 104 also may be carried out by any known method, although the Chien search should be decomposed into as many groups as there are syndrome groups. For example, a method for initializing multiple Chien search groups for a varying codeword start position is shown in commonly-assigned U.S. Pat. No. 8,621,331, which is hereby incorporated by reference herein in its entirety. In a Reed-Solomon decoder, Chien search block 104 also will contain a Forney algorithm to calculate the correction values, as is well known.

The remainder of this disclosure will focus on the syndrome calculation block 102.

The technique and circuits disclosed are useful for parallel decoders at any level of parallelism. There is no issue for slower decoders that process one symbol per clock cycle, but even the two-parallel-input case saves substantial resources.

The simplest case is when:

parallelism%codeword_length=codeword_length/2

This case has a period of 2 (the input pattern ends on a clock boundary after every second codeword).

More complex cases arise when there is long period—i.e., a large number of codewords before the pattern repeats. As the period increases, eventually the technique disclosed herein is no longer efficient, and two syndrome circuits are needed, as shown for example in above-incorporated U.S. Pat. No. 8,621,331. The most extreme case is:

parallelism%codeword_length=1 which means that period is the codeword_length, although the two-syndrome solution can be more efficient even in less extreme cases.

The problem to be solved is best illustrated by the example of a Reed-Solomon code having a length of 544 symbols of which 514 are data symbols, commonly denoted RS(544,514).

Data may be received on 16 virtual channels, which has a natural width of 1280 bits (128 10-bit symbols), at 322 MHz for an implementation on a field-programmable gate array (FPGA). If 128 symbols are received by the decoder per clock cycle, 4.25 clock cycles would be needed to receive a complete codeword. Thus the codeword will end, and the next codeword will start, one-quarter of the way through a clock cycle, rather than on a natural parallel input boundary at the end of a cycle. This case has a period of 4 (the input pattern ends on a clock boundary after every fourth codeword). For the same code implemented on a fixed-logic circuit such as an ASIC, with a typical clock rate of 644 MHz, 64 symbols, rather than 128 symbols, can be processed per clock. The decoder would require 8.5 clocks to input each codeword. This case has a period of 2.

If, as in both of the foregoing cases, the codeword ends (and therefore starts) at varying locations, there are several straightforward ways to handle this problem, but each requires additional logic, or perhaps multiple clock domains (although the period-of-2 case is relatively simple).

For example, two syndrome calculation circuits could be provided. Any clock cycle in which a codeword boundary fell would give rise to two input streams—each in parallel with the other streams from a different one of the two codewords. The portion of each of those duplicated streams that applied to the other codeword would be filled with zeroes. Each syndrome calculation circuit would compute the different syndromes from one of the codewords. At most clock rates that could be expected to be encountered, by the time a third codeword began, the first codeword would be finished, so two syndrome calculation circuits would be sufficient for most cases. In addition to requiring two syndrome calculation circuits, this option also required buffering to duplicate the streams that spanned two codewords, with resultant delay.

However, in accordance with embodiments of the present invention, both the period-of-2 case and the period-of-4 case, as well as other cases, can be accommodated in a single clock domain with little additional logic, as described below.

Another known solution is to "gearbox" the data—i.e., to operate the decoder at a different clock rate than the data transfer. This can be explained with reference to FIGS. 2-4.

Figure 2:
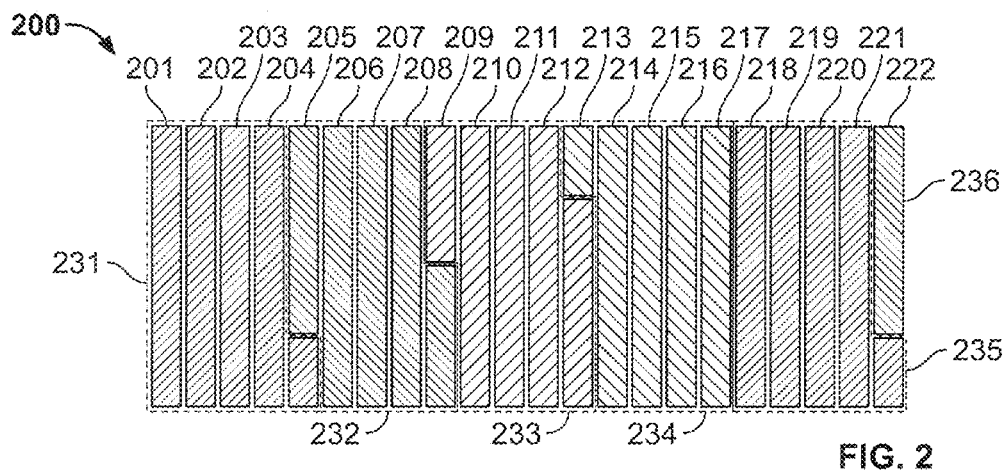
FIG. 2 shows typical codeword input pattern.

FIG. 2 shows a typical codeword input pattern 200 for an example of a 400 Gbps Ethernet embodiment. Each codeword is 544 symbols long, and 128 symbols are received per clock cycle. This means that four clock cycles 201-204 are needed for the first 512 symbols of a current codeword 250, while during the fifth clock cycle 205 the last 32 symbols from the current codeword 231, and the first 96 symbols from the next codeword 232, are received. The following 384 symbols of codeword 232 are received during the following three clock cycles 206-208, leaving the fifth clock cycle 209 to receive the last 64 symbols of codeword 232, as well as the first 64 symbols of the next codeword 233. The following 384 symbols of codeword 233 are received during the following three clock cycles 210-212, leaving the fifth clock cycle 213 to receive the last 96 symbols of codeword 233, as well as the first 32 symbols of the next codeword 234. The remaining 512 symbols of codeword 234 are received during clock cycles 214-217. As can be seen, after four codewords, the pattern repeats beginning with codeword 235 during clock cycles 218-221 plus part of clock cycle 222, which also contains portion 236 of yet another codeword.

Thus, the pattern requires five clock cycles to complete the first codeword, and then an additional four cycles each to finish the three additional codewords in the pattern of 4. As seen, each individual codeword requires at least a portion of each of five clock cycles to be processed.

Figure 3:
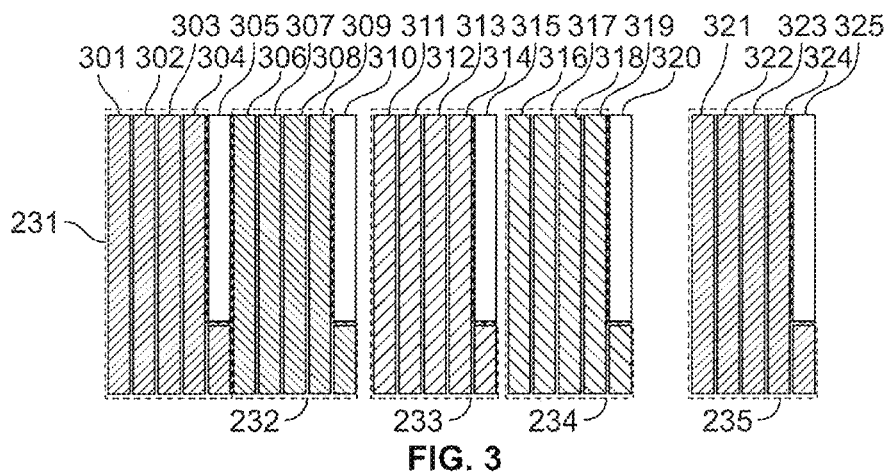
FIG. 3 shows gearboxing "in time" of the input pattern of FIG. 2.

This can be accomplished by gearboxing "in time" as shown in FIG. 3, in which the decoder is run at a clock rate five-fourths (i.e., 125%) of the clock rate of the input data, so that five clock cycles of the decoder can complete during each four clock cycles of the input data. During each of clock cycles 301-304, 306-309, 311-314, 316-319 and 321-324, 128 symbols are processed. During each of clock cycles 305, 310, 315, 320 and 325, 32 symbols are processed along with 96 '0' symbols.

Figure 4:
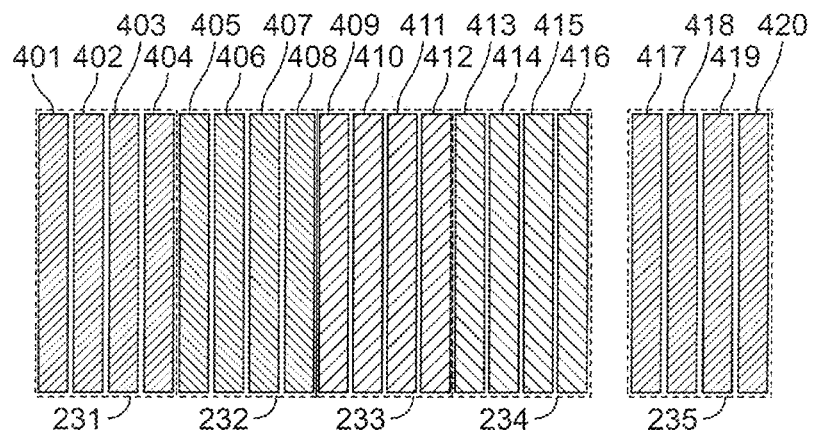
FIG. 4 shows gearboxing "in width" of the input pattern of FIG. 2.

Another known option, shown in FIG. 4, is gearboxing "in width"—i.e., providing a decoder that operates at the same clock rate but processes more symbols per clock cycle. In the example of FIG. 2, each codeword requires 4.25 clock cycles. If the width of the decoder is increased by a factor of 4.25/4, each codeword requires only 4 clock cycles. If the original decoder processes 128 symbols per clock cycle, that means that the wider decoder should process 136 symbols per cycle. Thus, as seen in FIG. 4, the first codeword 231 that took part of five clock cycles to complete can be completed in four clock cycles 401-404, while each of the next three codewords 232-234 are completed in additional groups of four clock cycles each (405-408, 409-412 and 413-416). Because the original clock is not changed, but more is being done in each clock cycle, one clock cycle out of seventeen (in this example) remains unused. The pattern then repeats with the clock cycle before clock cycle 417 remaining unused and the next codeword 235 being processed in clock cycles 417-420, etc.

Figure 5:
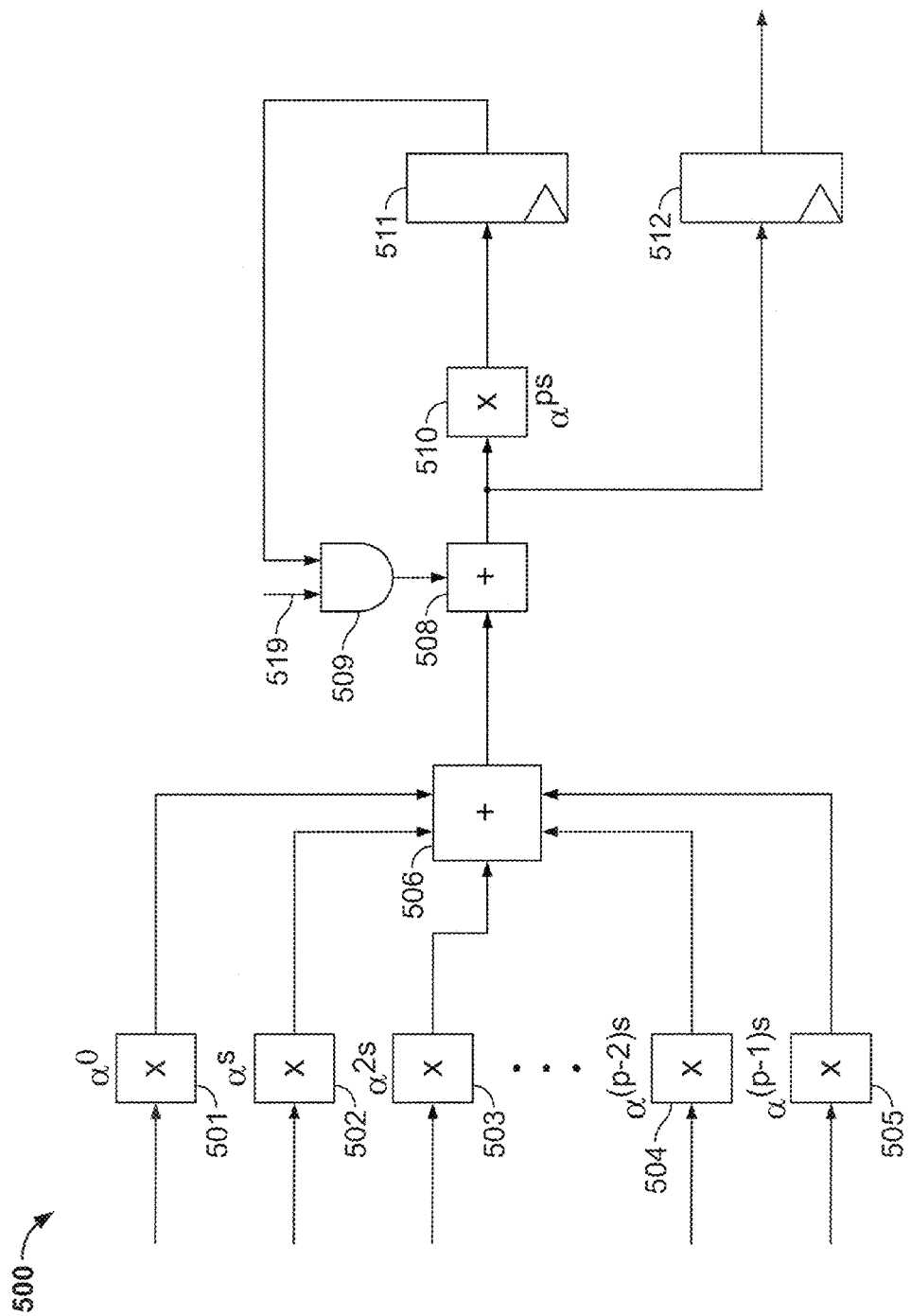
FIG. 5 is a schematic representation of a known syndrome calculation circuit.

Each of those techniques requires parallel calculation of syndromes. A known circuit 500 for calculating syndromes in parallel is shown in U.S. Pat. No. 8,347,192, which is hereby incorporated by reference herein in its entirety, and is diagrammed in FIG. 5. In FIG. 5, each multiplier 501-505 is a Galois field (GF()) multiplier. $\alpha$ is the first root of the Galois field polynomial, p is the parallelism of the decoder implementation (i.e., the number of parallel symbol inputs), and s is the index of the syndrome which ranges from 0 to n-k-1 (where k is the number of data symbols). Each of the p parallel input symbols is input to a respective one of GF() multipliers 501-505, where it is multiplied by a respective coefficient which is one of p ascending powers of $\alpha$, from $\alpha^0$ to $\alpha^{(p-1)s}$ ($\alpha^0=1$, but is shown as $\alpha^0$ to illustrate the increasing powers of the root). For the foregoing example, an RS(544,514) codeword will have 30 syndromes, so the index will range from s=0 to s=29.

The results of the multipliers 501-505 are then summed by GF( ) adder 506. The sum is then added by second GF( ) adder 508 to the running total of the syndrome (which is accumulated in register 511), and multiplied by the $p^{th}$ power of the root for that syndrome by GF() multiplier 510, with the result stored in register 511. On the last clock of the syndrome calculation the addition is latched by register 512 before the multiplication at 510, and the accumulator 511 is reset, which can be implemented by zeroing the feedback path using the second input 519 of AND-gate 509.

Above-incorporated U.S. Pat. No. 8,347,192 also describes additional optional circuit optimizations for the circuitry 500.

A simple example can be illustrated for a codeword with 12 symbols. The 12 symbols in the codeword may be represented as $c_0$ to $c_{11}$, from the last received symbol to the first (i.e., $c_{11}$ arrives first and $c_0$ arrives last). The syndrome is defined as:

$$s_1 = c_0 + c_1\alpha^1 + c_2\alpha^2 + c_3\alpha^3 + c_4\alpha^4 + c_5\alpha^5 + c_6\alpha^6 c_7\alpha^1 c_8 \alpha^8 + c_9\alpha^9 c_{10}\alpha^{10} c_{11}\alpha^{11} \quad (3)$$

Circuitry 500 calculates this, using Horner's rule, as:

$$S_1 = c_0 + c_1\alpha^1 + c_2\alpha^2 + c_3\alpha^3 + \alpha^4(c_4 + c_5\alpha^1 + c_6\alpha^2 + c_7\alpha^3 + \alpha^4 (c_8 + c_9\alpha^1 + c_{10}\alpha^2 + c_{11}\alpha^3)) \quad (4)$$

As noted above, circuitry 500 works best when codeword boundaries coincide with clock boundaries. Otherwise, gearboxing, along with additional logic, as well as multiple copies of circuitry 500 in many cases, are required.

In accordance with embodiments of the present invention, calculation of syndromes can be carried out in a single decoder at any degree of parallelism and regardless of the alignment, or lack thereof, of codeword boundaries with clock boundaries.

The p parallel input streams are divided into a number of groups, with that number determined as described below. The coefficients span all of the groups as though they were a single group as in FIG. 5. Some or all of the groups are combined depending on the location of the codeword boundary as described below, and are accumulated as in FIG. 5. A different combination of the groups is added to the accumulated result, and the result of that addition is adjusted based on location of the codeword boundary as described below.

The number of groups g generally corresponds to the number of codewords that are received, including a first codeword starting on a clock boundary, before the codeword boundary coincides again with a clock boundary. The number g may be determined as follows. If the codeword length is n and the parallelism is p, and if % is the modulus operator and $\equiv$ is the congruence operator, then if p%(n≡p)=0, one can define a ring, and g=p/(n%p) will be the number of groups into which the vector of p symbols should be divided. If p/(n%p) is not a positive whole number, one can use g=p/(p−(n%p)) which will be a positive whole number.

For example, for the RS(544,514) decoder described above, n=544. For a 322 MHz implementation on an FPGA, one can expect p=128. This would lead to the number of groups being p/(n%p)=128/(544%128)=128/32=4 groups.

In another example, for an RS(33,25) decoder with p=9, p/(n%p)=9/(33%9)=9/6=1.5 groups. This is not a whole number, so one can use p/(p−(n%p))=9/(9−(33%9))=9/(9−6)=9/3=3 groups.

Figure 6:
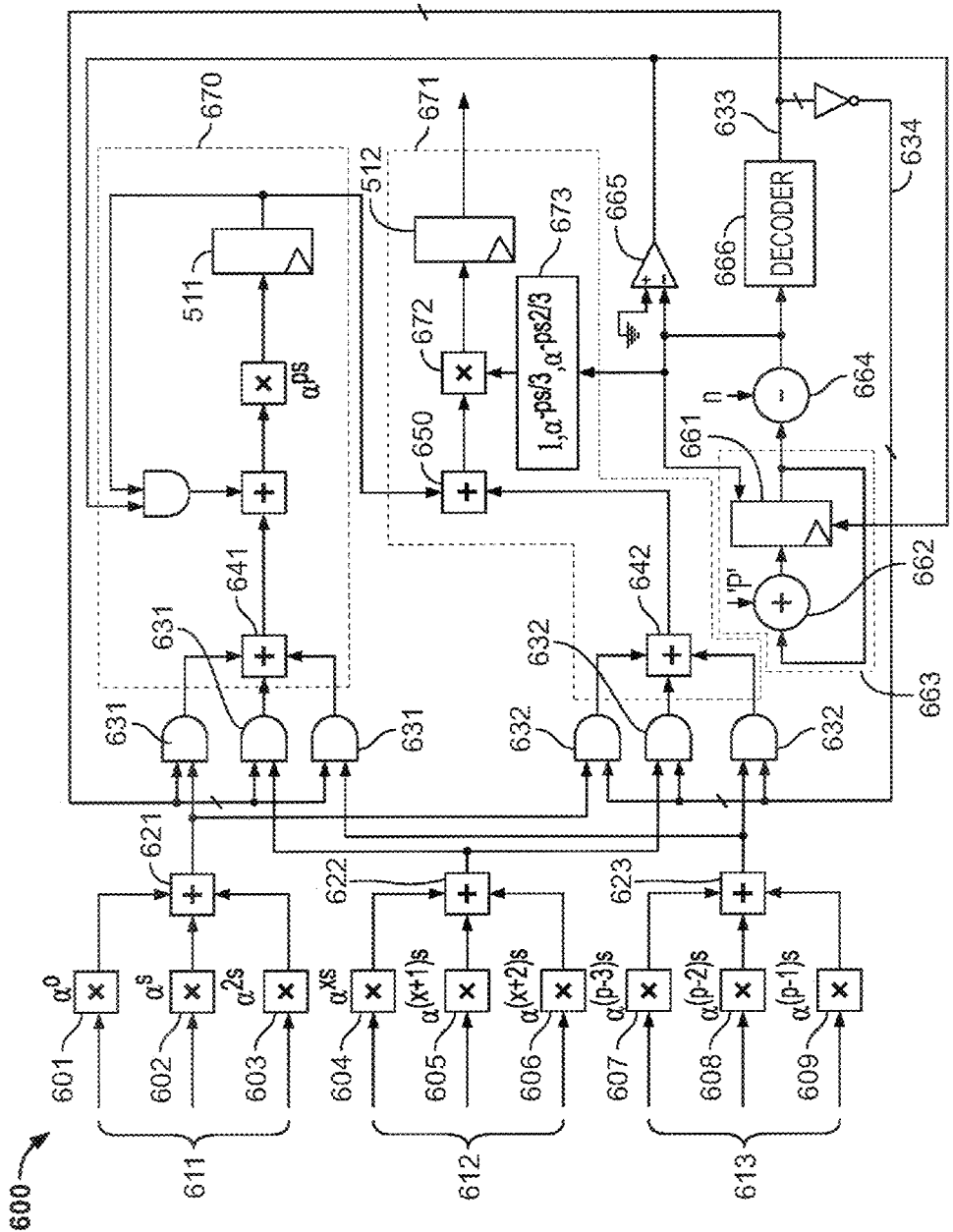
FIG. 6 is a schematic representation of a syndrome calculation circuit in accordance with embodiments of the invention.

A circuit implementation 600 for the case of p=9 is shown in FIG. 6. In a fixed device, the circuit will be built in accordance with the expected value of p; in a configurable device such as an FPGA, the different configurations can be instantiated according to the value of p needed for the particular design.

The p (i.e., 9 in this example) parallel symbol streams are input to p Galois field (GF()) multipliers 601-609. As in circuitry 500, the coefficients for GF() multipliers 601-609 are $\alpha^0$ to $\alpha^{(p-1)s}$ as though they belonged to a single group. However, GF() multipliers 601-609 are divided into g=3 (as determined above) groups 611, 612, 613. In each group, the member GF() multiplier results are added together by respective first-round GF() adder 621, 622, 623. Although the coefficients of multipliers 601-609 are $\alpha^0$ to $\alpha^{(p-1)s}$ as noted above, in FIG. 6, the coefficients of multipliers 604-606 of group 612 are indicated as $\alpha^{xs}$ to $\alpha^{(x+2)s}$ for generality—i.e., to indicate that an arbitrary number of parallel streams may be divided into an arbitrary number of groups; here, x=3.

The outputs of first-round adders 621, 622, 623 are directed to accumulate adder 641 and output adder 642, but are gated by accumulate AND-gates 631 and output AND-gates 632. Accumulate AND-gates 631 receive accumulate control signal 633 as their respective second inputs, while output AND-gates 632 receive output control signal 634, which is the inverse of accumulate control signal 633, as their respective second inputs.

Thus, a particular first-round adder output will be added either to the accumulate circuit 670 or the output circuit 671, as described below. Accumulate circuit 670 operates in a manner similar to the operation of FIG. 5. In output circuit 671, accumulator output 511 is added at 650 to the output of output adder 642 and that sum 650 is adjusted to reflect that because the codeword did not end on a clock boundary, all of the roots of the finite field were not applied, also as described below.

The assignment of a first-round adder output to either to accumulate circuit 670 or output circuit 671, and the adjustment of sum 650, are both controlled by selection circuitry 660. Register 661 and adder 662 (whose inputs are the contents of register 661 and the constant p) form a count-by-p counter 663. Subtractor 664 (whose inputs are the contents of register 661 as the subtrahend, and the constant n as the minuend), and comparator 665 (which compares the output of subtractor 664 to '0') forms a modulo condition detector. On each clock, counter 663 will count up by p. As long as a codeword boundary has not been reached, the value in counter 663 will be less than n, subtractor 664 will have a negative output, and the output of comparator 665 will be '1'.

As soon as a codeword boundary is reached, the value in counter 663 will exceed n, subtractor 664 will have a positive output, and the output of comparator 665 will be '0', resetting accumulator 511 via AND-gate 509. The output of comparator 665 also will reset register 661 to the output of subtractor 664.

The output of subtractor 664 controls the adjustment of sum 650 by selecting an adjustment factor from lookup table 673, by which sum 650 is multiplied at 672. Generally, if the last codeword processed ends on a clock boundary, then no adjustment is needed. But if the last codeword processed ends part-way through a clock cycle—i.e., q/g of the way, where q is an integer between 0 and g−1, then the last coefficient applied is $\alpha^{qps/g}$, which needs to be backed out by an adjustment factor $\alpha^{-qps/g}$. This may be selected from lookup table 673 using, as an index, the output of subtractor 664, which, when not negative, will be qp/g.

The output of subtractor 664 also can be decoded to control the assignment of a first-round adder output to either to accumulate circuit 670 or output circuit 671. The input to decoder 666 will always equal at most (g+1)p−n and therefore will be ceil(log$_2$((g+1)p−n)) bits long. The number of bits in the output of decoder 666 will be equal to the number of groups g into which the p inputs are divided, with each bit corresponding to a group and '1' in each bit signifying that the corresponding group is directed to accumulate circuit 670, and a '0' specifying that the corresponding group is directed to output circuit 671. Specifically, the output of decoder 666 can be decoded from the ceil(log$_2$g) most-significant bits of the input of decoder 666.

In the RS(544,514) example with p=128, the non-negative inputs to decoder 666 will be ceil(log$_2$(((5) 128)−544))=ceil(log$_2$(96))=8 bits long and will cycle through the decimal values 0, 32, 64 and 96. With four groups as disclosed above, ceil(log$_2$(4))=2. The two most-significant bits of the eight-bit non-negative input of decoder 666 will be 00, 01, 10 and 11. These can be used as the index to a lookup table (not shown) to provide signals 633 and 634 which provide control bits for the four accumulate AND-gates 631 (only three are shown because FIG. 6 represents the RS(33,25) case) and the four output AND-gates 632 (only three are shown because FIG. 6 represents the RS(33, 25) case) in the pattern 1111/0000 (same as when the input is negative), 1110/0001, 1100/0011 and 1000/0111. There also will be four adjustment factors $\alpha^0$ (i.e., '1'), $\alpha^{-32s}$, $\alpha^{-64s}$, and $\alpha^{-96s}$ to select from in lookup table 673.

In the RS(33,25) example with p=9 and g=3, the number of input bits to decoder 666 will be ceil(log$_2$((4×9)−33))=4 and the non-negative inputs to decoder 666 will cycle through the decimal values 0, 3 and 6. With three groups as disclosed above, ceil(log$_2$(3))=2. The two most-significant bits of a three-bit non-negative input of decoder 666 will be 00, 01 and 11. These can be used as the index to a lookup table (not shown) to provide signals 633 and 634 which provide control bits for the three accumulate AND-gates 631 and the three output AND-gates 632 in the pattern 111/000 (same as when the input is negative), 110/001 and 100/011. There also will be three adjustment factors $\alpha^0$ (i.e., '1'), $\alpha^{-3s}$ and $\alpha^{-6s}$ to select from in lookup table 673.

It will be apparent, then, that as soon as a codeword boundary is reached, output circuit 671 provides the current syndrome, while accumulate circuit 670 begins accumulating the next syndrome, thereby eliminating the need for an additional syndrome calculation circuit or the need to buffer symbols while waiting until the syndrome calculation circuit is free.

Figure 7:
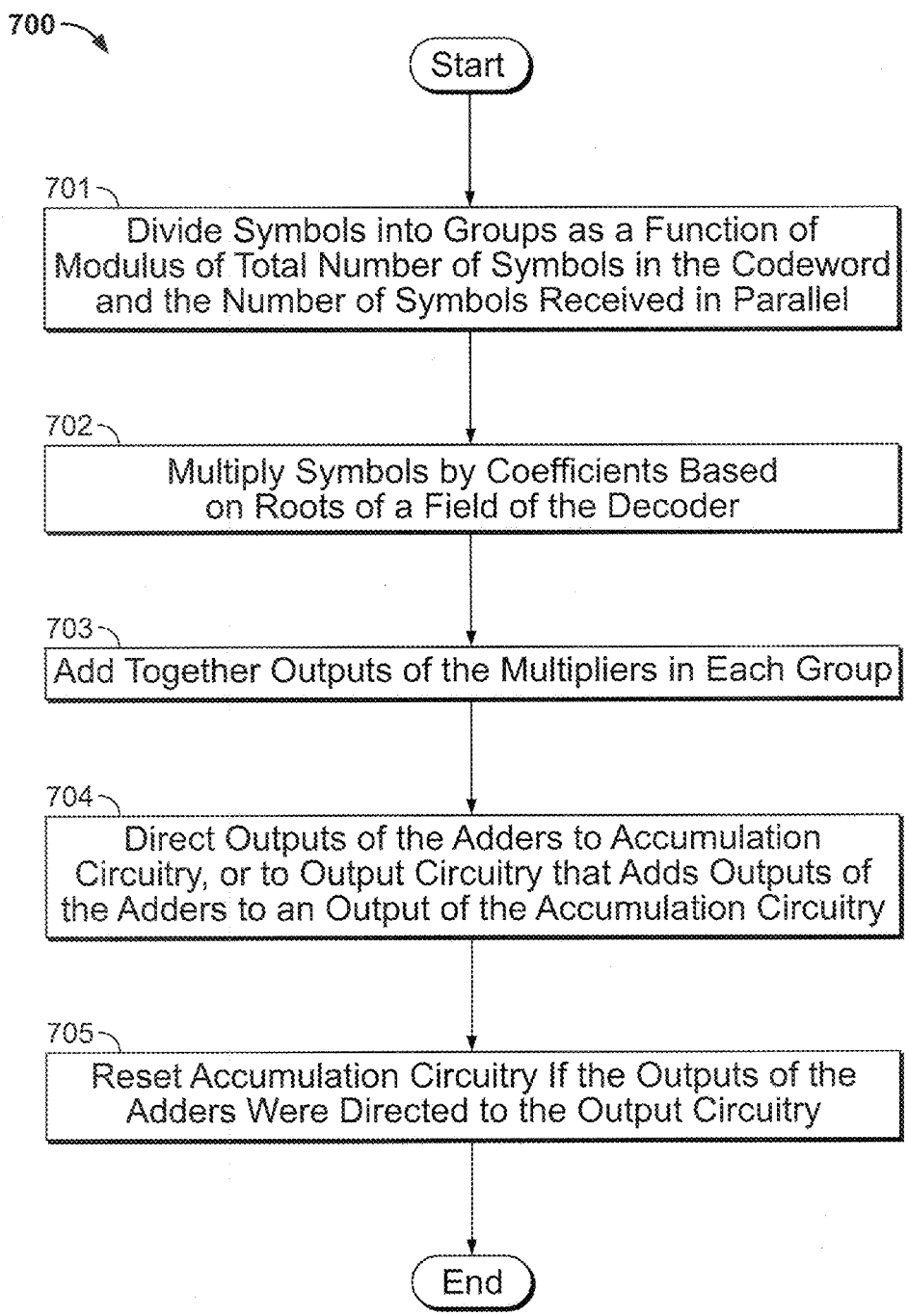
FIG. 7 is a flow diagram of a method according to an embodiment of the present invention for performing a syndrome calculation.

A method 700 of operating syndrome calculation circuitry in a decoder 100 is diagrammed in FIG. 7.

At 701, the number of symbols that the decoder receives in parallel is divided into a number of groups determined as a function of a modulus of the number of symbols in the codeword and the number of symbols received in parallel. At 702, at each of a plurality of multipliers equal in number to the number of symbols that the decoder receives in parallel, one of the symbols is received and is multiplied by a coefficient based on a root of a field of the decoder. At 703, outputs of the multipliers in each respective one of the groups are added together. At 704, outputs of the adders are directed either to accumulation circuitry, or to output circuity that adds outputs of the adders to an output of the accumulation circuitry. At 705, the accumulation circuitry is reset when the outputs of the adders are directed to the output circuitry, and method 700 ends.

Figure 8:
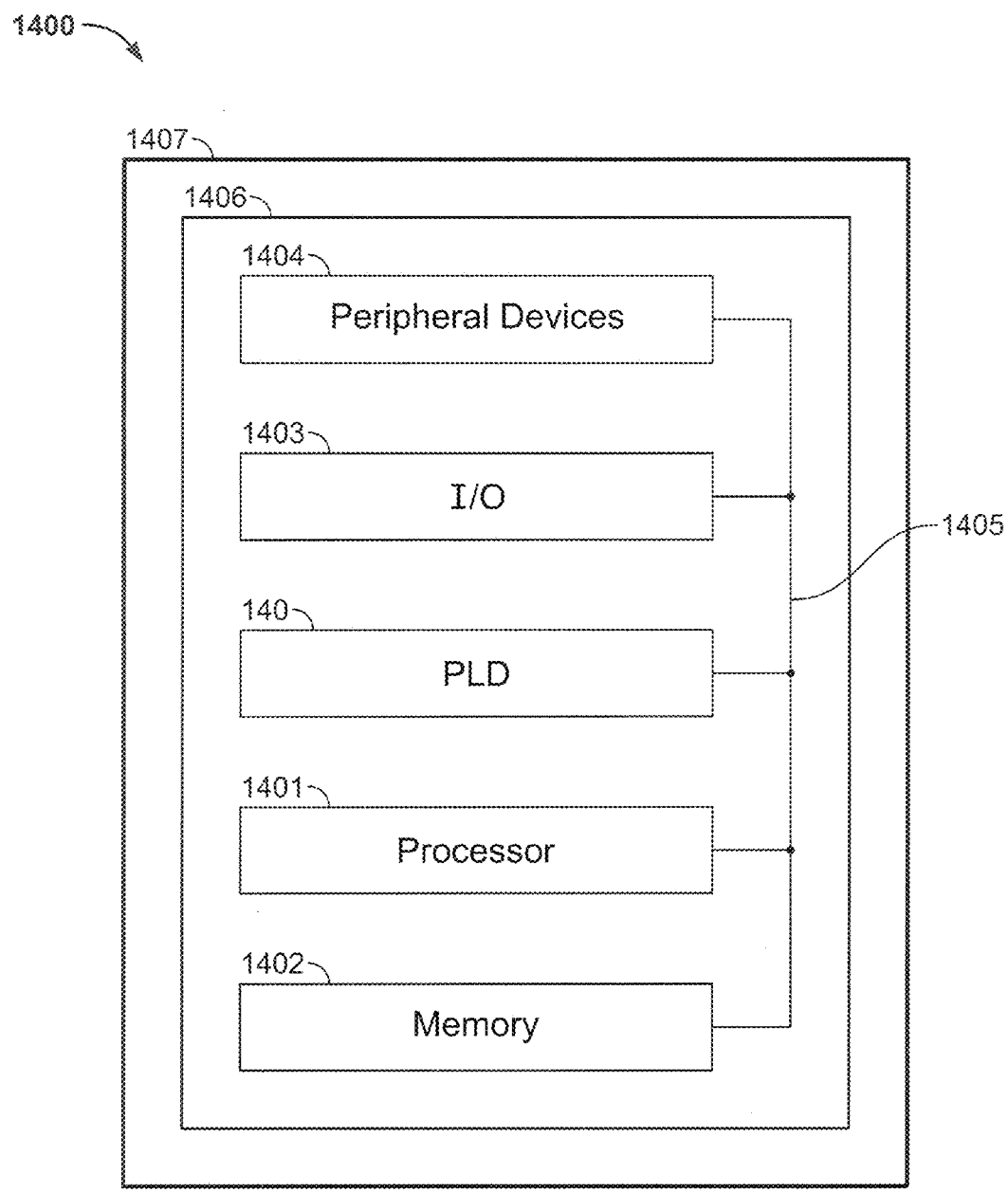
FIG. 8 is a simplified block diagram of an exemplary system employing a programmable logic device configured according to the present invention.

An integrated circuit device such as a PLD 140 configured to include syndrome calculation circuitry according to an implementation of the present invention may be used in many kinds of electronic devices. One possible use is in an exemplary data processing system 1400 shown in FIG. 8. Data processing system 1400 may include one or more of the following components: a processor 1401; memory 1102; I/O circuitry 1403; and peripheral devices 1404. These components are coupled together by a system bus 1405 and are populated on a circuit board 1406 which is contained in an end-user system 1407.

System 1400 can be used in a wide variety of applications, such as computer networking, data networking, instrumentation, video processing, digital signal processing, Remote Radio Head (RRH), or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to a shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

Figure 9:
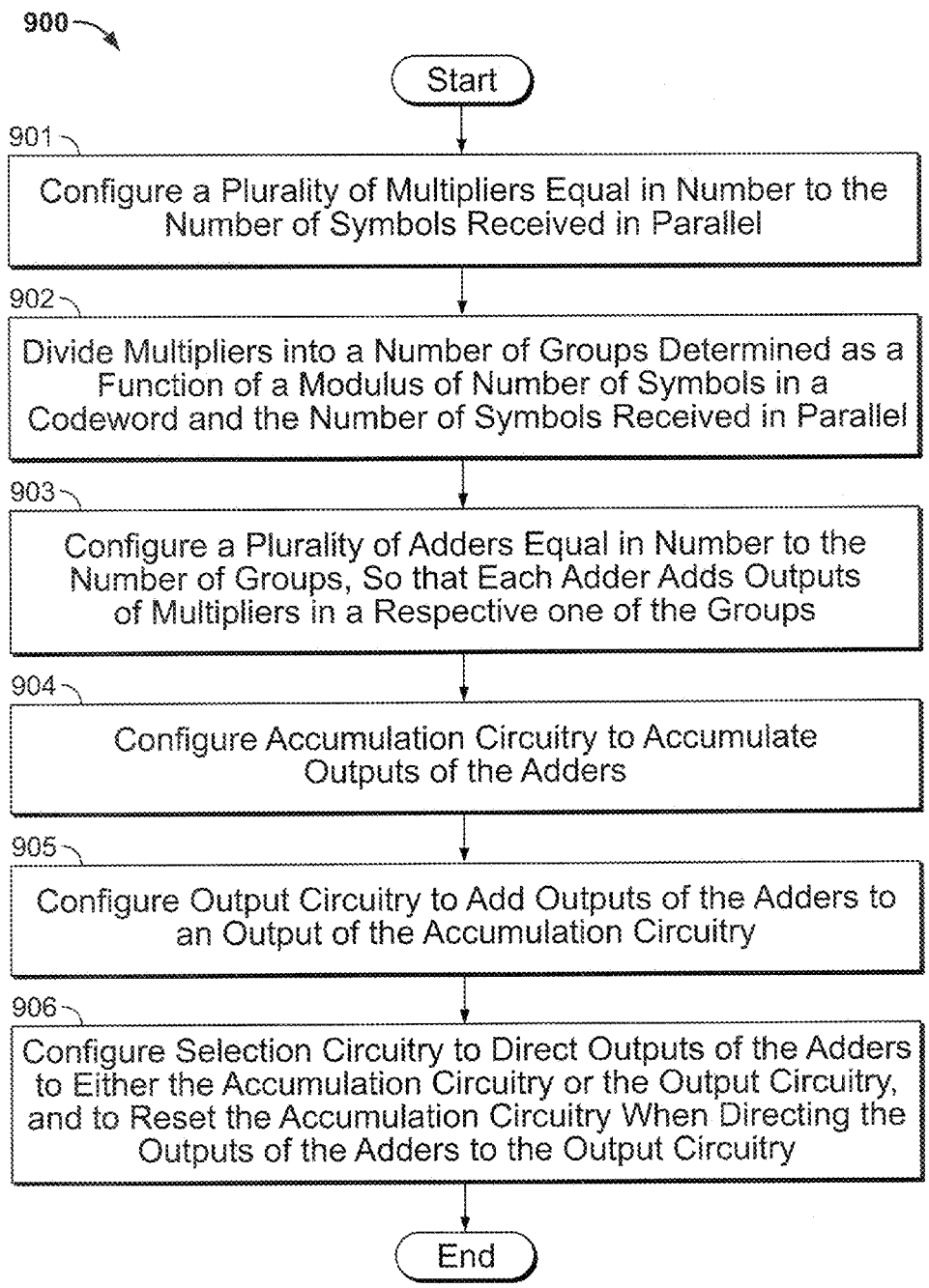
FIG. 9 is a flow diagram of a method according to an embodiment of the present invention for configuring a programmable integrated circuit device as circuitry according to the present invention.

A method 900 of programming a programmable device as syndrome calculation circuitry according to an embodiment of the invention is diagrammed in FIG. 9. At 901, a plurality of multipliers equal in number to the number of symbols received in parallel is configured, so that each multiplier receives one of the symbols and multiplies that one of the symbols by a coefficient based on a root of a field of the decoder. At 902, the plurality of multipliers is divided into a number of groups of adjacent multipliers, where the number of groups is determined as a function of a modulus of number of symbols in a codeword and the number of symbols received in parallel. At 903, a plurality of adders equal in number to the number of groups is configured, including configuring each respective one of those adders to add outputs of multipliers in a respective one of the groups. At 904, accumulation circuitry to accumulate outputs of said adders is configured. At 905, output circuitry is configured to adding outputs of the adders to an output of the accumulation circuitry to provide a syndrome output. At 906, selection circuitry is configured to direct outputs of the adders to one of the accumulation circuitry or the output circuity, and to reset the accumulation circuitry when directing the outputs of the adders to the output circuitry, and method 900 ends.

Instructions for carrying out a method according to this invention for programming a programmable device may be encoded on a machine-readable medium, to be executed by a suitable computer or similar device to implement the method of the invention for programming or configuring PLDs or other programmable devices. For example, a personal computer may be equipped with an interface to which a PLD can be connected, and the personal computer can be used by a user to program the PLD using suitable software tools as described above.

Figure 10:
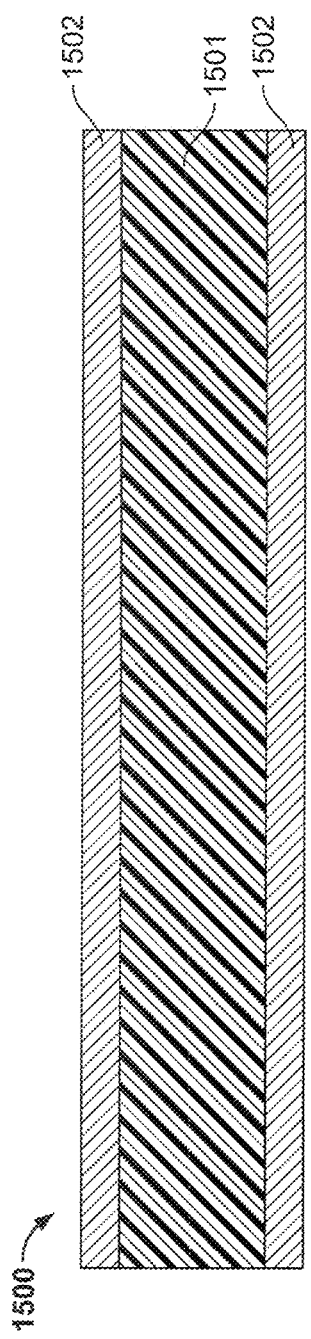
FIG. 10 is a cross-sectional view of a magnetic data storage medium encoded with a set of machine-executable instructions for performing the method of FIG. 9.

FIG. 10 presents a cross section of a magnetic data storage medium 1500 which can be encoded with a machine executable program that can be carried out by systems such as the aforementioned personal computer, or other computer or similar device. Medium 1500 can be a floppy diskette or hard disk, or magnetic tape, having a suitable substrate 1501, which may be conventional, and a suitable coating 1502, which may be conventional, on one or both sides, containing magnetic domains (not visible) whose polarity or orientation can be altered magnetically. Except in the case where it is magnetic tape, medium 1500 may also have an opening (not shown) for receiving the spindle of a disk drive or other data storage device.

The magnetic domains of coating 1502 of medium 1500 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 11:
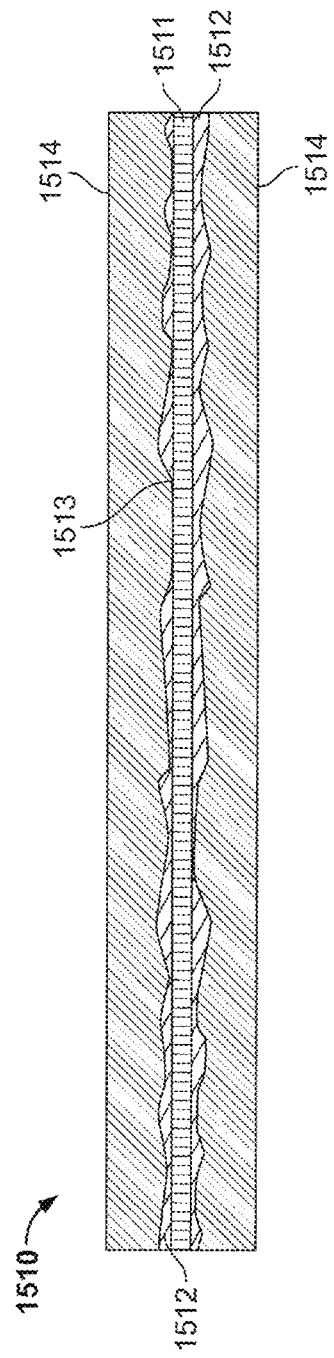
FIG. 11 is a cross-sectional view of an optically readable data storage medium encoded with a set of machine executable instructions for performing the method of FIG. 9.

FIG. 11 shows a cross section of an optically-readable data storage medium 1510 which also can be encoded with such a machine-executable program, which can be carried out by systems such as the aforementioned personal computer, or other computer or similar device. Medium 1510 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 1510 preferably has a suitable substrate 1511, which may be conventional, and a suitable coating 1512, which may be conventional, usually on one or both sides of substrate 1511.

In the case of a CD-based or DVD-based medium, as is well known, coating 1512 is reflective and is impressed with a plurality of pits 1513, arranged on one or more layers, to encode the machine-executable program. The arrangement of pits is read by reflecting laser light off the surface of coating 1512. A protective coating 1514, which preferably is substantially transparent, is provided on top of coating 1512.

In the case of magneto-optical disk, as is well known, coating 1512 has no pits 1513, but has a plurality of magnetic domains whose polarity or orientation can be changed magnetically when heated above a certain temperature, as by a laser (not shown). The orientation of the domains can be read by measuring the polarization of laser light reflected from coating 1512. The arrangement of the domains encodes the program as described above.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. Syndrome calculation circuitry for a decoder of codewords having a first number of symbols, where the decoder receives a second number of symbols in parallel, and where the first number is not evenly divisible by the second number, the syndrome calculation circuitry comprising:
    a plurality of multipliers equal in number to the second number, each multiplier receiving one of said symbols and multiplying said one of said symbols by a coefficient based on a root of a field of said decoder, said plurality of multipliers being divided into a number of groups of adjacent multipliers, said number of groups being determined as a function of a modulus of said first number and said second number;
    a plurality of adders equal in number to said groups, each respective one of said adders adding outputs of multipliers in a respective one of said groups;
    accumulation circuitry for accumulating outputs of said adders;
    output circuitry for adding said outputs of said adders to an output of said accumulation circuitry to provide a syndrome output; and
    selection circuitry for directing said outputs of said adders to one of said accumulation circuitry or said output circuity, and for resetting said accumulation circuitry when directing said outputs of said adders to said output circuitry.

2. The syndrome calculation circuitry of claim 1 wherein said function of said modulus of said first number and said second number is a quotient of said second number and said modulus.

3. The syndrome calculation circuitry of claim 1 wherein said function of said modulus of said first number and said second number is a quotient of said second number and a difference between said second number and said modulus.

4. The syndrome calculation circuitry of claim 1 wherein said selection circuitry comprises:
    a counter that counts by said second number, said counter being reset, when said counter exceeds said first number, to a value by which said counter exceeds said first number; and a decoder that converts said value to a selection signal that directs the respective output of each of said adders to one of said accumulation circuit or said output circuit.

5. The syndrome calculation circuitry of claim 4 wherein:
said selection circuitry further comprises, for each respective one of said adders, a first AND gate receiving for input said output of said respective one of said adders and outputting to said accumulation circuitry, and a second AND gate receiving for input said output of said respective one of said adders and outputting to said output circuitry; and
each respective bit of said selection signal is another input to said first AND gate for each respective one of said adders, and an inverse of each said respective bit of said selection signal is another input to said second AND gate for each respective one of said adders.

6. The syndrome calculation circuitry of claim 4 further comprising a comparator that, when said counter exceeds said first number, outputs a reset signal that resets said accumulation circuitry.

7. The syndrome calculation circuitry of claim 4 wherein said output circuitry adjusts said syndrome output based on said value by which said counter exceeds said first number.

8. The syndrome calculation circuitry of claim 7 wherein said output circuitry comprises:
a lookup table loaded with adjustment factors; and
counter/decoder circuitry providing an index into said lookup table.

9. A method of configuring, on an integrated circuit device, syndrome calculation circuitry for a decoder of codewords having a first number of symbols, where the decoder receives a second number of symbols in parallel, and where the first number is not evenly divisible by the second number, the method comprising:
configuring a plurality of multipliers equal in number to the second number, so that each multiplier receives one of said symbols and multiplies said one of said symbols by a coefficient based on a root of a field of said decoder, said configuring a plurality of multipliers including dividing said plurality of multipliers into a number of groups of adjacent multipliers, said number of groups being determined as a function of a modulus of said first number and said second number;
configuring a plurality of adders equal in number to said groups, including configuring each respective one of said adders to add outputs of multipliers in a respective one of said groups;
configuring accumulation circuitry to accumulate outputs of said adders;
configuring output circuitry to add said outputs of said adders to an output of said accumulation circuitry to provide a syndrome output; and
configuring selection circuitry to direct said outputs of said adders to one of said accumulation circuitry or said output circuity, and to reset said accumulation circuitry when directing said outputs of said adders to said output circuitry.

10. The method of claim 9 wherein said configuring selection circuitry comprises:
configuring a counter that counts by said second number, said counter being configured to reset, when said counter exceeds said first number, to a value by which said counter exceeds said first number; and
configuring a decoder that converts said value to a selection signal that directs the respective output of each of said adders to one of said accumulation circuit or said output circuit.

11. The method of claim 10 further comprising configuring a comparator that, when said counter exceeds said first number, outputs a reset signal that resets said accumulation circuitry.

12. The method of claim 10 wherein said configuring output circuitry comprises configuring said output circuitry to adjust said syndrome output based on said value by which said counter exceeds said first number.

13. The method of claim 12 wherein said configuring said output circuitry to adjust said syndrome output comprises:
configuring a lookup table loaded with adjustment factors; and
configuring counter/decoder circuitry to provide an index into said lookup table.

14. A nontransitory machine-readable medium encoded with instructions for causing a machine to configure, on a programmable integrated circuit device, syndrome calculation circuitry for a decoder of codewords having a first number of symbols, where the decoder receives a second number of symbols in parallel, and where the first number is not evenly divisible by the second number, said instructions comprising:
instructions to configure a plurality of multipliers equal in number to the second number, so that each multiplier receives one of said symbols and multiplies said one of said symbols by a coefficient based on a root of a field of said decoder, including instructions to divide said plurality of multipliers into a number of groups of adjacent multipliers, said number of groups being determined as a function of a modulus of said first number and said second number;
instructions to configure a plurality of adders equal in number to said groups, including instructions to configure each respective one of said adders to add outputs of multipliers in a respective one of said groups;
instructions to configure accumulation circuitry to accumulate outputs of said adders;
instructions to configure output circuitry to add said outputs of said adders to an output of said accumulation circuitry to provide a syndrome output; and
instructions to configure selection circuitry to direct said outputs of said adders to one of said accumulation circuitry or said output circuity, and to reset said accumulation circuitry when directing said outputs of said adders to said output circuitry.

15. The nontransitory machine-readable medium of claim 14 wherein said instructions to configure selection circuitry comprise:
instructions to configure a counter that counts by said second number, said counter being configured to reset, when said counter exceeds said first number, to a value by which said counter exceeds said first number; and
instructions to configure a decoder that converts said value to a selection signal that directs the respective output of each of said adders to one of said accumulation circuit or said output circuit.

16. The nontransitory machine-readable medium of claim 15 wherein said instructions further comprise instructions to configure a comparator that, when said counter exceeds said first number, outputs a reset signal that resets said accumulation circuitry.

17. The nontransitory machine-readable medium of claim 15 wherein said instructions to configure output circuitry comprise instructions to configure said output circuitry to adjust said syndrome output based on said value by which said counter exceeds said first number.

18. The nontransitory machine-readable medium of claim 17 wherein said instructions to configure said output circuitry to adjust said syndrome output comprises:
  instructions to configure a lookup table loaded with adjustment factors; and
  instructions to configure counter/decoder circuitry to provide an index into said lookup table.

* * * * *